United States Patent
Radke et al.

(10) Patent No.: US 8,296,510 B2
(45) Date of Patent: Oct. 23, 2012

(54) HYBRID MEMORY MANAGEMENT

(75) Inventors: William H. Radke, Los Gatos, CA (US); Michael Murray, Mountain View, CA (US); Martin Ragnar Furuhjelm, Grass Valley, CA (US); John Geldman, Los Gatos, CA (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 13/295,616

(22) Filed: Nov. 14, 2011

(65) Prior Publication Data
US 2012/0059992 A1    Mar. 8, 2012

Related U.S. Application Data

(62) Division of application No. 12/127,945, filed on May 28, 2008, now Pat. No. 8,060,719.

(51) Int. Cl.
*G06F 12/00* (2006.01)
*G06F 13/00* (2006.01)
*G06F 13/28* (2006.01)
(52) U.S. Cl. ................ 711/103; 711/154; 711/165
(58) Field of Classification Search .......... 711/103, 711/154, 165
See application file for complete search history.

(56) References Cited

U.S. PATENT DOCUMENTS

| | | | |
|---|---|---|---|
| 6,785,767 B2 | 8/2004 | Coulson | |
| 2008/0077728 A1* | 3/2008 | Kim et al. | 711/103 |
| 2008/0082735 A1* | 4/2008 | Shiga | 711/103 |
| 2008/0083735 A1 | 4/2008 | Takai et al. | |
| 2008/0126680 A1* | 5/2008 | Lee et al. | 711/103 |
| 2008/0215800 A1* | 9/2008 | Lee et al. | 711/103 |
| 2009/0043831 A1* | 2/2009 | Antonopoulos et al. | 707/205 |

OTHER PUBLICATIONS

Obr, et al. "Non Volatile Cache Command Proposal for ATA8-ACS" Microsoft Corporation, Jun. 3, 2005, pp. 1-23 (DRAFT).
Li-Pin Change, "Hybrid Solid-State Disks: Combining Heterogeneous NAND Flash in Large SSDs", Asia and South Pacific Design Automation Conference (ASPDAC), IEEE Mar. 21-24, 2008, pp. 428-433. (See p. 429, paragraph 2—p. 431, paragraph 2.).

* cited by examiner

*Primary Examiner* — Jared Rutz
*Assistant Examiner* — Ryan Bertram
(74) *Attorney, Agent, or Firm* — Lerner, David, Littenberg, Krumholz & Mentlik, LLP (57) ABSTRACT

Methods and apparatus for managing data storage in hybrid memory devices utilizing single level and multi level memory cells. Logical addresses can be distributed between single level and multilevel memory cells based on a frequency of write operations performed. Initial storage of data corresponding to a logical address in memory can be determined by various methods including initially writing all data to single level memory or initially writing all data to multilevel memory. Other methods permit a host to direct logical address writes to single level or multilevel memory cells based on anticipated usage.

21 Claims, 6 Drawing Sheets

HYBRID MEMORY MANAGEMENT

RELATED APPLICATION

This application is a Divisional of U.S. application Ser. No. 12/127,945, titled "HYBRID MEMORY MANAGEMENT," filed May 28, 2008 now U.S. Pat. No. 8,060,719, (allowed) which is commonly assigned and incorporated herein by reference.

TECHNICAL FIELD

The present disclosure relates generally to memory devices and in particular the present disclosure relates to managing data stored in a memory device having single and multi level memory cell storage capability.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data, such as a basic input/output system (BIOS), are typically stored in flash memory devices for use in personal computer systems.

Flash memory typically utilizes one of two basic architectures known as NOR Flash and NAND Flash. The designation is derived from the logic used to read the devices. In a NAND type flash memory array architecture, the floating gate memory cells of the memory array are arranged in a matrix of rows and columns. The memory cells of the array are also arranged together in strings, typically of 8, 16, 32, or more each, where the memory cells in the string are connected together in series, source to drain, between a common source line and a column transfer line, often referred to as a bit line. The array is then accessed by a row decoder activating a row of floating gate memory cells by selecting the word line connected to their gates. In addition, bit lines can also be driven high or low depending on the current operation being performed.

As the performance and complexity of electronic systems increase, the requirement for additional memory in a system also increases. However, in order to continue to reduce the costs of the system, it is desirable to keep the parts count low. This can be accomplished by increasing the memory density of an integrated circuit by using such technologies as multi-level cells (MLC). For example, MLC NAND flash memory is a cost effective non-volatile memory.

Multilevel memory cells assign a data state (e.g., as represented by a bit pattern) to a specific range of threshold voltages (Vt) stored on the memory cell. Single level memory cells (SLC) permit the storage of a single bit of data on each memory cell. Meanwhile, MLC technology permits the storage of two or more bits per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges (e.g., levels), which are sometimes referred to as Vt distribution windows, used to represent a bit pattern comprised of N-bits is $2^N$. For example, one bit may be represented by two levels, two bits by four levels, three bits by eight levels, etc.

For example, a cell may be assigned a Vt that falls within one of four different voltage ranges of 200 mV, each being used to represent a data state corresponding to a bit pattern comprised of two bits. Typically, a dead space (which is sometimes referred to as a margin) of 0.2V to 0.4V is maintained between each range to keep the Vt distributions from overlapping. If the voltage stored on the cell is within the first of the four Vt distributions, the cell in this case is storing a logical '11' state and is typically considered the erased state of the cell. If the voltage is within the second of the four Vt distributions, the cell in this case is storing a logical '10' state. A voltage in the third distribution of the four Vt distributions would indicate that the cell in this case is storing a logical '00' state. Finally, a Vt residing in the fourth Vt distribution indicates that a logical '01' state is stored in the cell.

There are advantages and disadvantages associated with using SLC or MLC memory. MLC memory is generally considered more cost effective in regards to memory density as MLC memory can, for example, store multiple bits of data in a single memory cell as opposed to SLC memory which is conventionally used to store one bit of data per cell. However, conventional SLC memory can be written to many (e.g., by an order magnitude) more times than conventional MLC memory. For example, a characteristic of conventional MLC memory is that after data has been erased and re-written about 10,000 times the memory may become subject to significant read and write errors. Conventional SLC memory on the other hand typically may be erased and re-written about 100,000 times before the reliability of the data begins to deteriorate. These density and performance characteristics also apply between different types of MLC arrays. MLC devices with four and eight levels exist today, while denser memories are being researched. While an MLC with more levels would be more efficient (higher density) than an MLC with less levels (lower density), these higher density devices may have performance penalties over the lower density devices. The case of a device built with SLC (two level) and MLC (more than two level) can be generalized as a device with multiple memory arrays, each with its own density and performance trade-offs. An example is a device built with an array of MLC (four level) and an array of MLC (eight level). There could even be more than two arrays of memories, such as SLC, MLC (four level) and MLC (eight level). A common naming convention is to refer to SLC memory as MLC (two level) memory as SLC memory utilizes two levels in order to store one bit of data as represented by a 0 or a 1, for example. MLC memory configured to store two bits of data can be represented by MLC (four level), three bits of data by MLC (eight level), etc. An MLC (four level) memory cell is typically referred to as a lower density memory cell than an MLC (eight level) memory due to the lower number of bits stored per memory cell, for example. SLC (e.g., MLC (two level)) is typically referred to as a lower density memory than MLC (four level) memory and so on.

For the reasons stated above, and for other reasons stated below which will become apparent to those skilled in the art upon reading and understanding the present specification, there is a need in the art for hybrid memory devices that are adapted to manage the utilization of memory of different densities, such as SLC and MLC memory, to take advantage of preferred operating characteristics associated with each type of memory.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present disclosure is defined only by the appended claims, along with the full scope of equivalents to which such claims are entitled.

As discussed above, conventional SLC and MLC memory have both positive and negative attributes associated with them. SLC memory allows for faster write operations and can withstand far more write operations before reliability of the memory cells begin to degrade as compared to MLC memory. However, SLC memory is not as efficient as MLC memory in that MLC memory can store multiple bits of data on each memory cell whereas SLC is used to store only a single bit per cell. Various embodiments of the present disclosure store data that is frequently updated in SLC memory and store data that is updated less frequently in MLC memory. This can be used to enhance the efficiency and reliability of memory devices. Although some embodiments are disclosed with reference to utilizing SLC and MLC memory, the various embodiments are not so limited. For example, one embodiment may utilize SLC memory, sometimes referred to as MLC (two level) memory, and MLC (four level) memory. Another embodiment may utilize MLC (four level) and MLC (eight level) memory. Still other embodiments can utilize three or more memory arrays such as SLC, MLC (four level) and MLC (eight level) memory in the same memory device, for example. Other combinations are possible according to the various embodiments of the present disclosure. Thus the embodiments can utilize a combination of different level (e.g., density) memory in a memory device.

Data in a non-volatile memory device can be accessed through an abstraction called a logical block address (LBA) that does not define where the data physically resides in the device. The device can also have physical block addresses (PBA) that define a physical location, but does not define or imply what data is kept in this location. In a magnetic disk device, a physical block address translates to a specific cylinder, head, and sector. In a solid state non-volatile memory device, the physical block address typically refers to a specific memory block address in a specific memory array. Logical block addresses and physical block addresses are well known to those skilled in the art. Memory devices maintain look up tables which map LBAs to their assigned PBAs. Conventional memory devices that have both SLC and MLC memory store data in either SLC memory or MLC memory. The data does not move between the SLC and MLC memory. This is in contrast with various embodiments of the present disclosure which cause the data stored in the memory device to move between SLC and MLC, such as based on the usage (e.g., number of write operations performed) of a given LBA. This usage is determined (e.g., tracked) and maintained for the LBAs of the memory device according to various embodiments of the present disclosure. Various embodiments of the present disclosure might also predict the usage for a given LBA and assign it to SLC or MLC memory accordingly. For example many file systems keep a data structure which is used to reference files to LBAs, such as a File Allocation Table (FAT), LBAs associated with such structures are likely to be subject to write operations on every file write operation. Thus, LBAs associated with the FAT could initially be assigned to SLC memory instead of MLC memory. Other embodiments adjust the location of a given LBA in SLC or MLC memory by acting in response to the actual tracked usage of each LBA. According to some embodiments of the present disclosure, an LBA may move between the SLC and MLC memory based on the actual usage of the LBA during operation of the memory device regardless of how the LBA was initially assigned.

Figure 1:
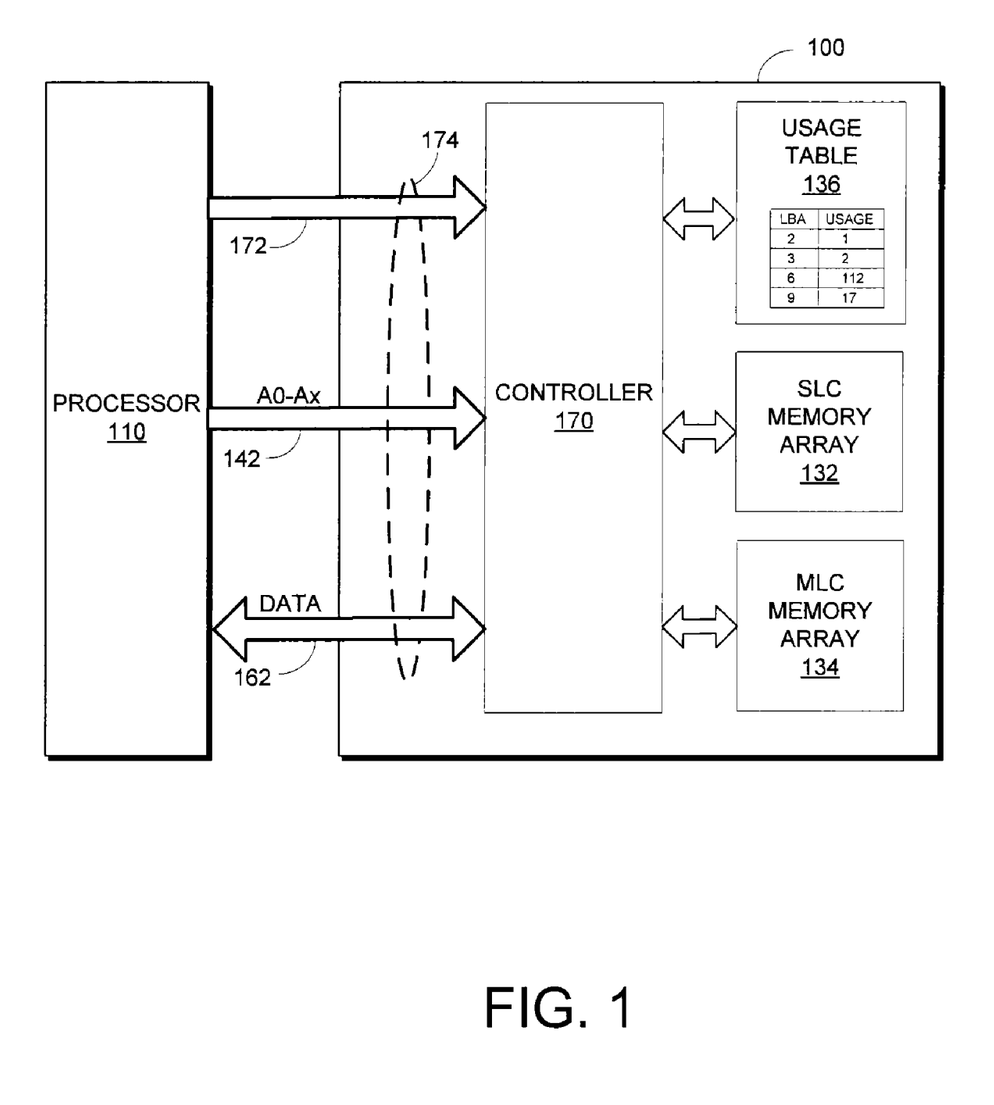
FIG. 1 is a functional block diagram of a memory module according to an embodiment of the present disclosure.

FIG. 1 illustrates a memory device according to an embodiment of the present disclosure. The memory device in FIG. 1 has been simplified to focus on various embodiments of the present disclosure. The memory device 100 comprises a controller 170 for controlling and managing the operations of the memory device 100 according to various embodiments of the present disclosure including managing the assignment of LBAs to either SLC or MLC (or between different density MLC) memory. The controller 170 can take the form of discrete logic or a state machine, for example. The controller 170 also incorporates various means for communicating with a host, such as a processor 110. For example, the controller 170 may incorporate a Universal Serial Bus (USB), SATA, PATA, ATA8-ACS, SD, MMC, Compact Flash, Memory Stick, IEEE 1394 or BA-NAND interface as are well known in the art. Physical wear leveling of the SLC and MLC memory can also be handled by the controller 170.

The memory device 100 also comprises an array of SLC memory 132 and an array of MLC memory 134. In some embodiments, the SLC 132 and MLC 134 memory may be separate flash memory chips while in others the SLC and MLC memory may be contained on one chip. The memory arrays 132 and 134 may also be comprised of different density MLC memory. Array 132 might be MLC (four level) and array 134 might be MLC (eight level), for example. The SLC 132 and MLC 134 memory illustrated in FIG. 1 may each be further comprised of multiple banks and blocks of memory. Each of the SLC 132 and MLC 134 memory blocks shown in FIG. 1 can be comprised of multiple memory chips. The amount (e.g. capacity) of SLC and MLC memory of the memory device 100 may or may not be equal. In some embodiments (e.g. a single chip comprising SLC and MLC memory) the size of the SLC array and MLC array may be assignable depending on the desired amount of SLC vs. MLC memory for a given application. In another embodiment according to the present disclosure, the memory device of FIG. 1 may be a two-way interleaved memory device having two SLC chips and two MLC chips. Other quantities of SLC and MLC chips are also possible according to various embodiments of the present disclosure.

The memory device of FIG. 1 also includes a usage table 136. The usage table is utilized by the controller 170 to store usage data (e.g. write operations performed) for the various LBAs of the memory device 100. For example, each time a write operation is performed on an LBA, the associated usage data for that LBA will updated. The usage table 136 may also store usage information (e.g., a time stamp) indicating when a given LBA was last written to as opposed to the number of times it has been written to. For example, LBAs may be mapped based on how much time has elapsed (e.g., a minute, a day, a month, etc.) since a particular LBA was last written to instead of a cumulative number of times it has been written to. In addition to assigning a time stamp to an LBA, LBAs may instead be assigned to a time group. LBAs assigned to a first time group may represent LBAs used in the current month whereas LBAs assigned to a second time group may represent LBAs used last month, for example. According to various embodiments, usage might also comprise tracking which LBAs are utilized at power up of the memory device or during a particular time frame following power up. The particular time frame may also follow a reset operation, for example. These LBAs may then be assigned to lower density (e.g., SLC) memory which can typically be accessed faster than higher density (e.g., MLC (four level)) memory. This can improve start up performance such as reducing access time during a boot load operation, for example. Usage data stored in the usage table 136 is not limited to usage of individual LBAs. Usage data may also be stored pertaining to use of multiple or ranges of LBAs. The usage table can also be cleared if desired. For example, a host 110 connected to the memory device 100 might send a particular command instructing that all or part of the usage table 136 be cleared. An example of a usage table is shown in block 136 of FIG. 1.

The usage table 136 may be stored in a standalone component such as an integrated circuit device having one or both of a volatile and non-volatile memory portion. For embodiments having both volatile and non-volatile memory, the volatile memory can maintain the current usage table during operation of the memory device. The usage table could then periodically be copied from the volatile memory to the non-volatile memory. The current usage table 136 can also be loaded into the volatile memory at power up and transferred back to non-volatile memory during power down of the memory device. Other embodiments allow for the usage table 136 data to be stored in the memory array 132/134 of the memory device 100. For example, the usage table data may be stored along with (e.g. appended to) the data associated with the LBA in the memory device. In other embodiments, the usage table may be stored in a dedicated location of either the SLC 132 or MLC 134 memory.

FIG. 1 also illustrates the memory device 100 coupled to a processor 110. The memory device 100 is coupled to the processor 110 by way of an interface 174, which may comprise multiple busses and signals. For example, control signals generated by the processor can be coupled to the memory device by a control bus 172. Additionally, an address bus 142 and a data bus 162 are also shown in the figure. The interface 174 may conform to one of the interface protocols discussed above (e.g. USB, SATA, PATA, et al.).

Figure 2:
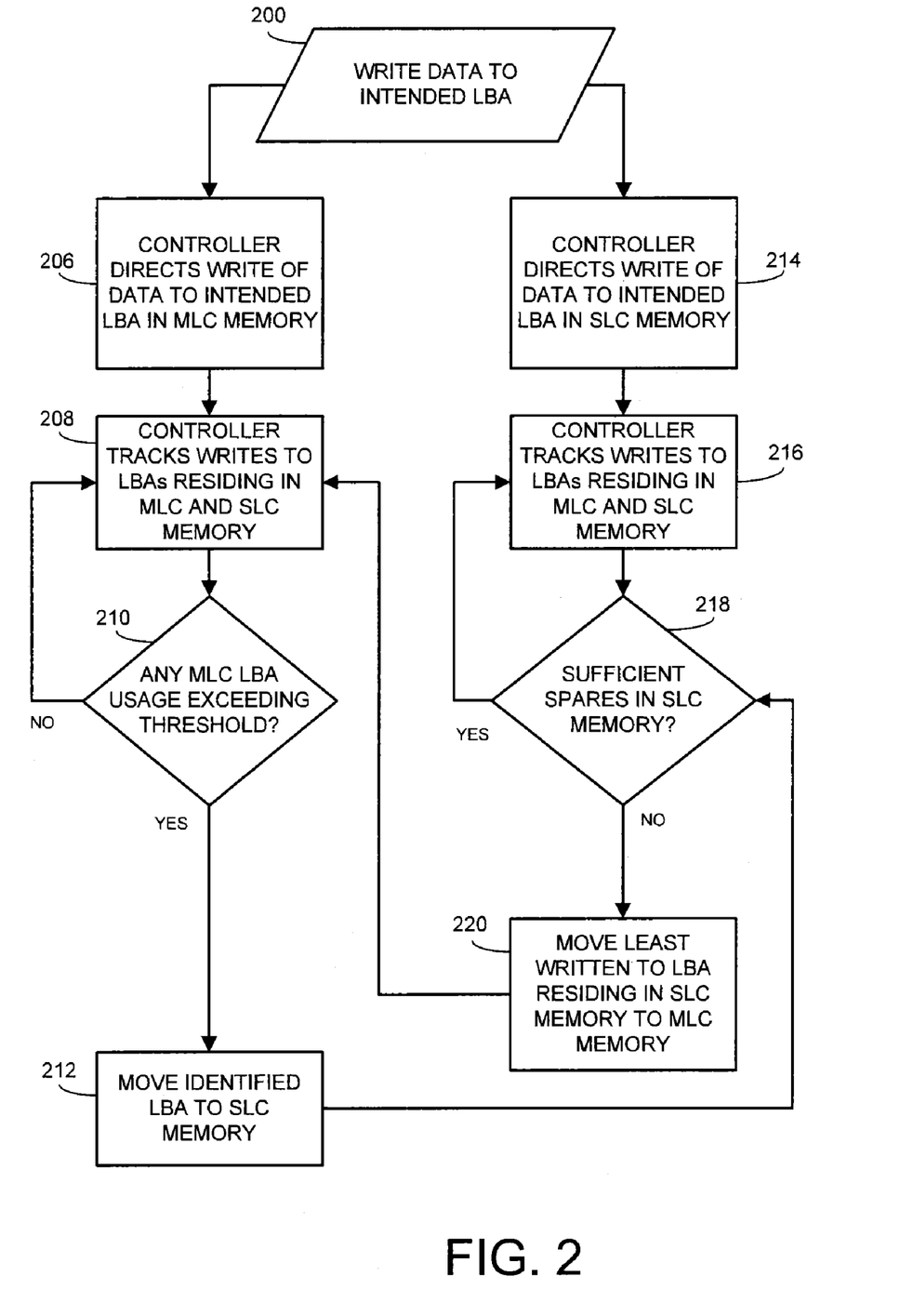
FIG. 2 is a flow chart illustrating multiple operations according to various embodiments of the present disclosure.

FIG. 2 illustrates a flow chart of some of the various activities performed by the controller 170 in implementing embodiments of the present disclosure. In some embodiments of the present disclosure, the controller of the memory device determines where an LBA 200 is to be assigned in the memory device 100. As discussed above, the FAT table is likely to be frequently used. Thus, according to one embodiment of the present disclosure, the controller 170 of the memory device 100 may assign LBAs associated with the FAT to SLC (e.g., MLC (two level) memory 214. The FAT LBAs according to this embodiment may also be permanently assigned (e.g. 'pinned') to SLC memory. In other embodiments, the controller may assign the FAT LBAs to MLC memory 206 and the controller 170 can move the FAT tables based on usage. Thus, according to one embodiment, all LBAs may be initially written to MLC memory 206. In other embodiments, all LBAs may be initially assigned to SLC memory 214. Still other embodiments may assign all LBAs having a write operation to be performed thereon to SLC memory. In these embodiments, should the LBA currently being written to be already assigned to MLC memory, the controller 170 can determine if the LBA being written to should ultimately be assigned to SLC or MLC memory.

The controller also tracks and maintains (e.g., updates) 208/216 the usage table data for LBAs of the memory device during operation. If the usage of an LBA currently assigned to MLC memory exceeds some threshold value 210, the controller will attempt to move the data associated with the LBA (and reassign the LBA to the location in) to SLC memory 212. In one embodiment, this threshold value may be 1000 write operations performed on a given LBA. The embodiments however are not limited to a single threshold value. For example, the threshold value may be some fraction of the total write operations performed on the memory 212. If the usage for all the LBAs assigned to MLC memory remain less than the threshold value, then those LBAs will continue to be assigned to the MLC memory.

According to one embodiment, each time an LBA is assigned to SLC memory, either from the controller 214 or because an LBA assigned to MLC memory has exceeded some threshold value 212, a determination is made regarding whether a sufficient number of spare locations remain in the SLC memory 218. Spare locations are desirable to allow for data handling and housekeeping functions to be performed on the memory device. If sufficient spares will exist in the SLC after the current write operation to SLC takes place, no further action by the controller is necessary and the LBA is assigned to the SLC memory. If however, the current assignment of an LBA to SLC memory will result in too few remaining spare locations in SLC memory, the controller will perform data management functions according to various embodiments of the present disclosure in order to preserve a minimum number of spare locations in the SLC memory. For example, the controller will review the usage data for each LBA currently assigned to SLC. Whichever LBA currently assigned to SLC memory has the least usage associated with it, the data associated with that LBA will be moved to MLC memory 220 (e.g., the next higher density memory.) In embodiments utilizing a time stamp to represent usage for the LBAs, the least recently used LBA assigned to SLC memory would be moved to MLC memory. According to one or more embodiments, data may be moved to the more dense memory (e.g., from SLC to MLC) if an LBA has not experienced a write operation over a particular period of time. For example, data may be moved from MLC (four level) to MLC (eight level) memory if the time stamp of the corresponding LBA indicates that the LBA has not been written to in more than a month. Other durations are possible according to various embodiments of the disclosure.

By performing the move operation of the data associated with the least used LBA currently assigned to SLC memory to MLC memory 220, a sufficient amount of spare locations should remain in SLC memory after the current LBA write operation to SLC memory is completed. The controller, according to some embodiments may also prevent the write operation to SLC memory from proceeding if the usage of the least used LBA currently assigned to SLC memory exceeds some amount. In this situation, the LBA prevented from being assigned to SLC memory might be assigned to MLC memory instead. When data associated with an LBA is moved from SLC to MLC 220, or vice versa 212, the usage data associated with that LBA is not incremented, at least according to one embodiment of the present disclosure.

The controller 170 can also perform physical wear leveling operations on the memory device while the movement of data associated with LBAs either within or between MLC and SLC memory is occurring according to various embodiments of the present disclosure. For example, an LBA assigned to MLC memory might be re-assigned to another PBA also located in MLC memory. Thus, the LBA remains in the desired area of memory (e.g. MLC or SLC) without performing all of the write operations on the same physical memory cells of the memory area. Similar physical wear leveling is also performed on the SLC area of memory.

Figure 3:
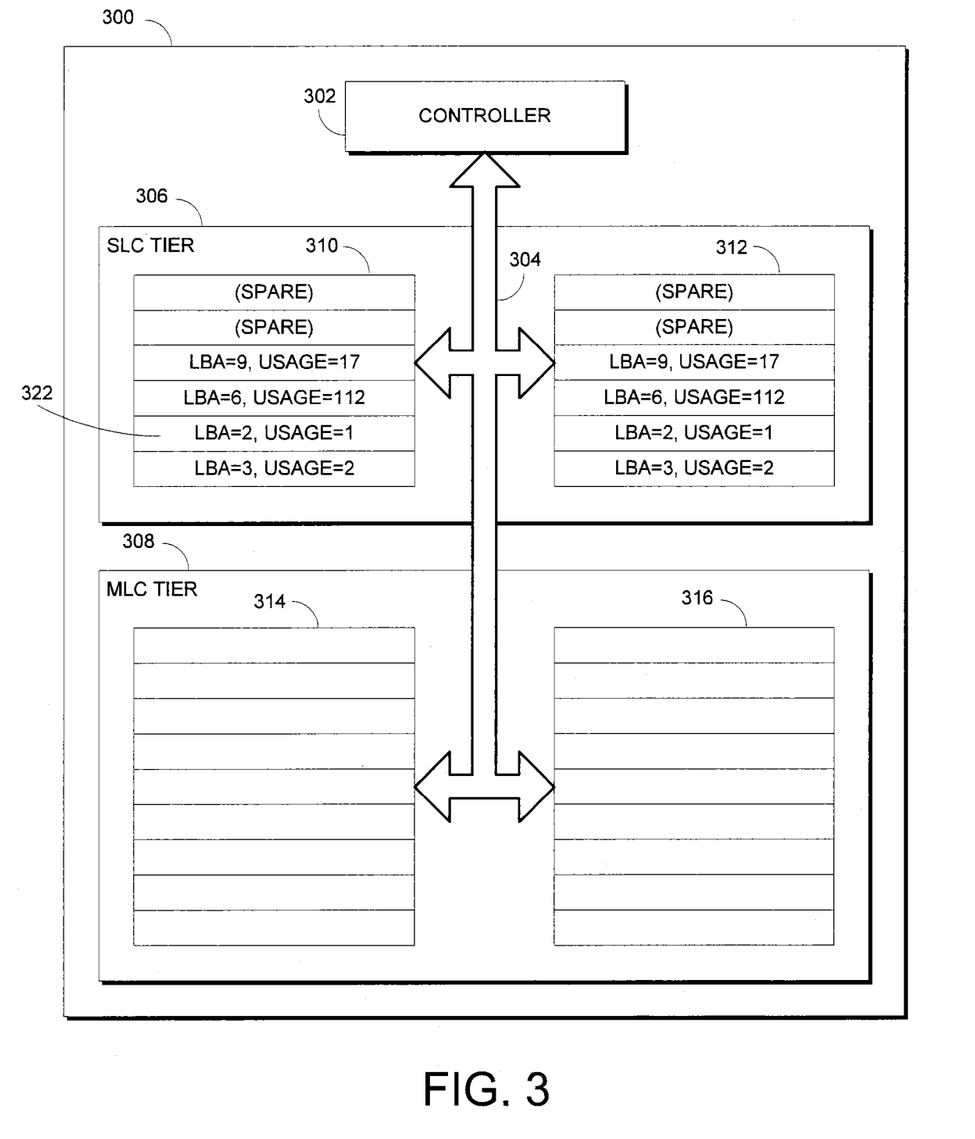
FIG. 3 illustrates one storage configuration of a memory device according to an embodiment of the present disclosure.
Figure 4:
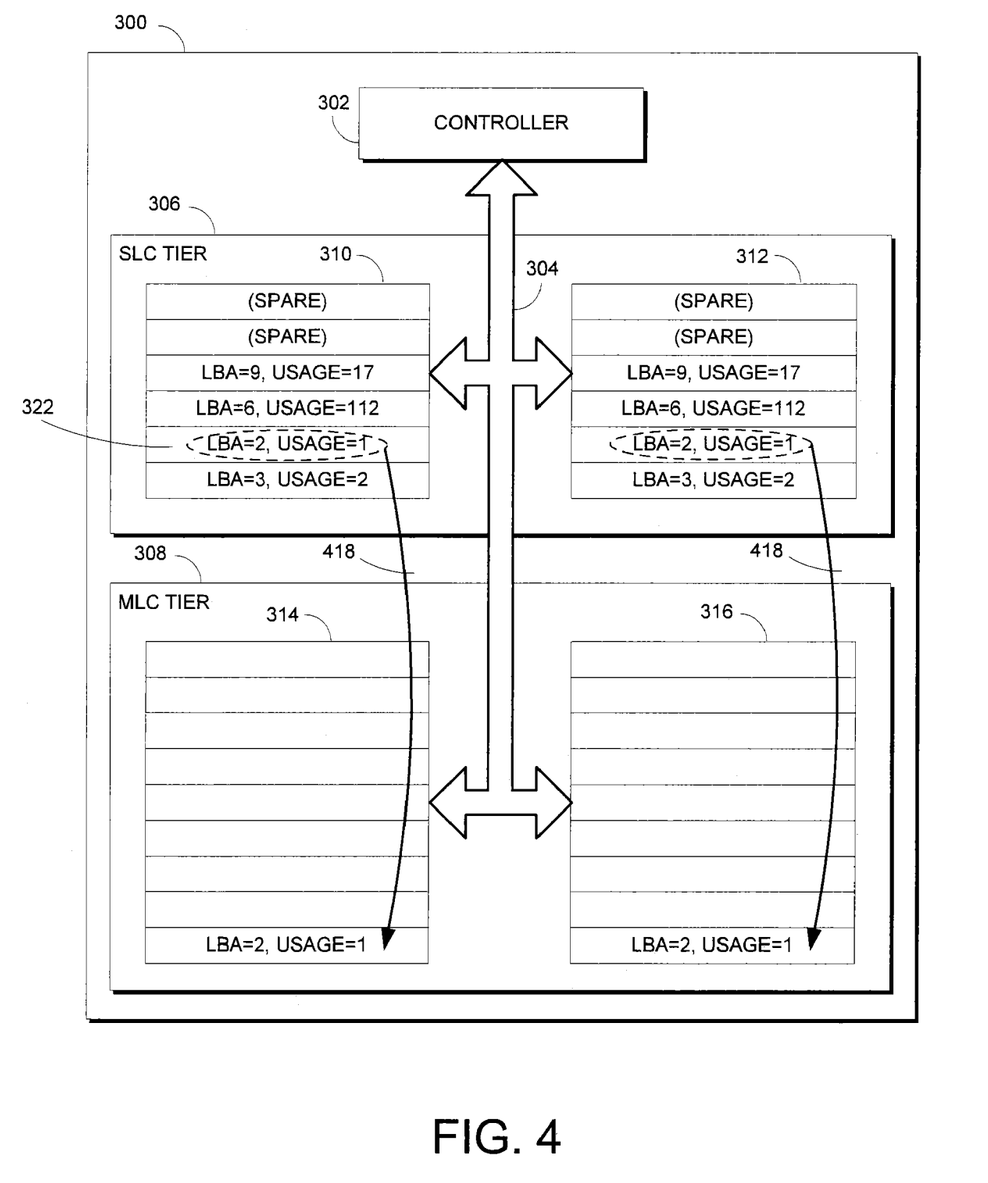
FIG. 4 illustrates a move operation of data according to an embodiment of the present disclosure.
Figure 5:
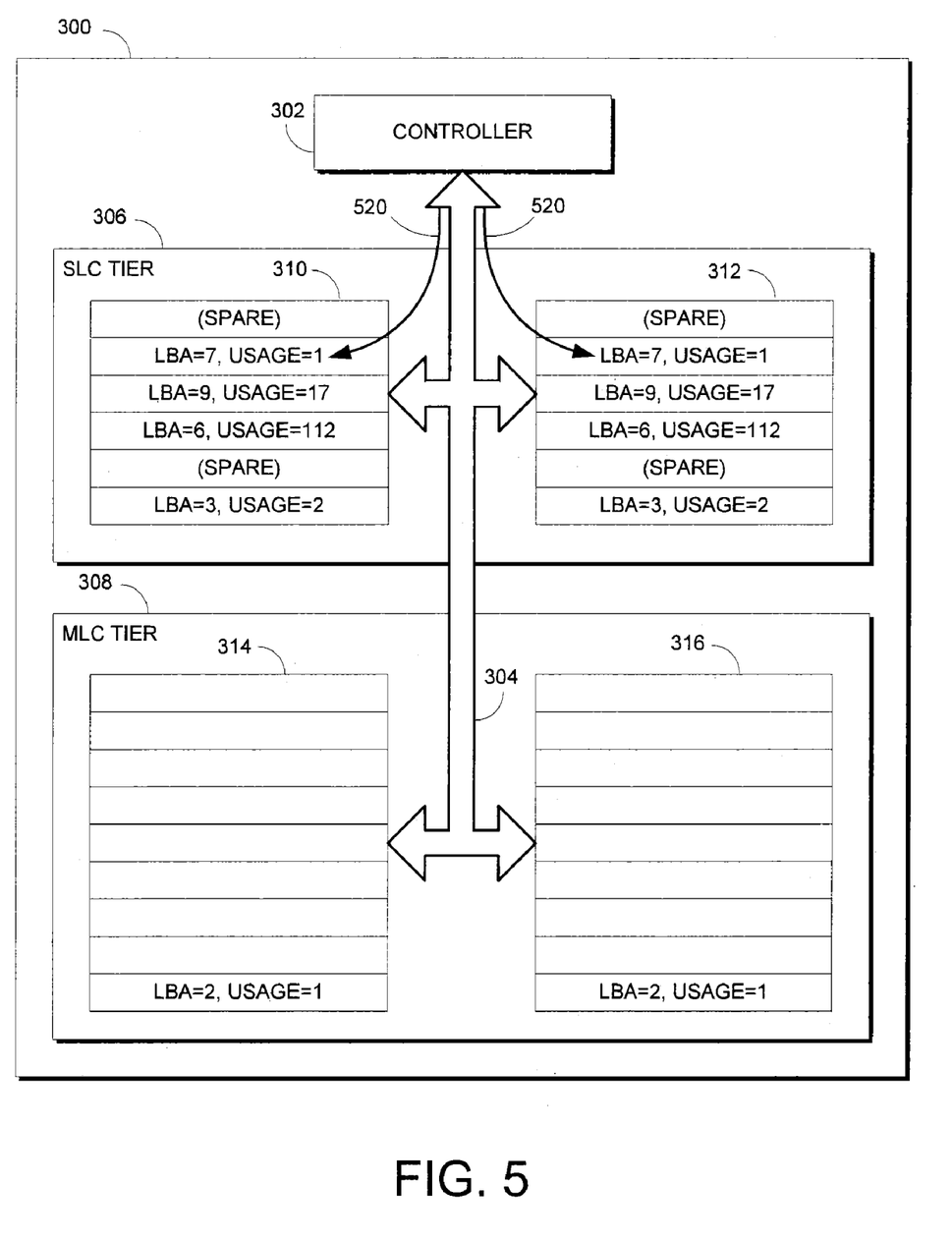
FIG. 5 illustrates a write operation of data according to an embodiment of the present disclosure.

FIGS. 3-5 illustrates a data move and write operation according to an embodiment of the present disclosure. FIG. 3 illustrates a two-way interleaved embodiment of a memory device 300. This configuration allows for large pieces of data to be shared by two memory chips. However, memory devices according to the present disclosure are not limited to two-way interleaved configurations. The memory device 300 of FIG. 3 is shown having a controller 302, a SLC memory 306, an MLC memory 308 and a data bus coupling the SLC and MLC memory to the controller 304. In the embodiment shown in FIG. 3, the SLC memory 306 comprises two flash SLC memory integrated circuits (e.g. chips) 310/312. The MLC memory 308 of the memory device 300 shown in FIG. 3 comprises two flash MLC memory chips 314/316. Other embodiments have different numbers of SLC and MLC chips, for example. The memory device shown in FIG. 3 has been simplified to focus on the embodiments of the present disclosure. Other components may be included in the memory device 300 as are known to those skilled in the art.

FIG. 3 shows locations 322 in SLC memory 306 along with their assigned LBAs and respective usage data. As discussed with respect to FIG. 1, the usage data may be stored in a location associated with the LBA or may be stored in a different location 136. The embodiment of FIG. 3 illustrates an embodiment wherein four LBAs have been previously assigned to SLC memory. Other embodiments may only have LBAs assigned to MLC memory at any given time. In the present embodiment shown in FIG. 3, the minimum number of spare SLC locations is two. However, embodiments of the present disclosure are not limited to maintaining two spare locations.

FIG. 4 illustrates an operation in which an LBA is to be assigned to SLC memory as is shown in block 214 of FIG. 2. In this example, a move operation is performed in order to make room for the new data and so as to maintain the required two spare locations in the SLC memory 306. Again referencing FIG. 2, the data associated with the LBA having the lowest usage is moved 220 to MLC memory in order to maintain the minimum number of spare locations in SLC memory 306. In this example, the data associated with LBA=2 (having a USAGE=1), which is assigned to location 322 is moved 418 to MLC memory 308. FIG. 5 illustrates a write operation 520 on LBA=7, wherein the associated data is written to the SLC memory 306. The write operation 520 and the move operation 418 may be performed in any order. The embodiments are not so limited that the move operation 418 must occur prior to the write operation 520. As illustrated in FIG. 5, one of the two required spare memory locations has effectively been relocated in the SLC memory. However, upon the conclusion of the write operation 520, two required spare locations are shown to still exist in the SLC memory 306. It should be noted that many more memory locations and LBAs are possible according to various embodiments of the present disclosure than are shown in FIGS. 3-5. In addition, move operations according to various embodiments may also involve moving a number of LBAs along with the LBA whose usage was used to determine a move operation was desired. For example, according to some embodiments, if any memory segment of the memory has an architecture that is most effectively used with accesses of multiples of logical blocks (e.g., 4 LBAs, 8 LBAs, etc.), the various embodiments may move groups of LBAs of these various sizes even if LBA usage is tracked by single LBAs. For example, if it has been determined that LBA=1 is to be moved, LBAs 2, 3, and 4 may also be moved during the same operation according to various embodiments of the present disclosure.

Referring again to FIG. 1, embodiments according to the present disclosure can incorporate a memory device 100 having a standard interface 174 to couple the memory device with a host, such as processor 110. There are various types of standard interfaces such as those adapted for hard disk drives (HDDs.) For example, SATA and PATA are common HDD interfaces. Additional standard non-HDD specific interfaces also exist in the art such as USB and SD interfaces. Embodiments of the present disclosure employing these and other standard interfaces and protocols can be used with currently existing processors and controllers already adapted to utilize these interfaces.

In one embodiment according to the present disclosure, the interface 174 and controller 170 are configured to emulate a standard HDD interface and protocol. Typically, HDDs contain both cache memory (e.g. RAM) and rotating magnetic media. A host interacting with a typical HDD will decide whether data needs to be stored in the HDD data cache or on the magnetic media. For example, the FAT will often be stored in the HDD data cache by the host because the FAT is likely to be updated frequently. Data that is less likely to be updated is stored on the magnetic media by the host. According to some embodiments of the present disclosure, the host 110 is not aware that the memory device 100 is not a typical HDD and therefore utilizes standard HDD commands when communicating with the memory device 100. According to embodiments of the present disclosure, the controller 170 is configured to receive data and instructions from the host and direct the storage in SLC 132 and/or MLC 134 memory accordingly. For example, the FAT table that the host believes is being stored in a HDD data cache would instead be stored in SLC memory 132 by the controller 170. Data that the host 110 intends to be stored on the magnetic media of a HDD (e.g. less frequently updated data) is stored in MLC memory 134. The controller 170 according to various embodiments of the present disclosure can then update the usage table 136 and perform operations on the LBAs, such as those discussed with reference to FIG. 2. For example, with respect to decision block 210 of FIG. 2, data associated with an LBA assigned to MLC memory 134 can be moved to SLC memory 132 (and the LBA re-assigned to the corresponding location in the SLC) should the usage value for the LBA exceed some particular value.

Another HDD interface and protocol exists which is similar to the standard HDD interface and protocol described above having RAM cache memory and rotating magnetic media. This interface and protocol is described in the "Non Volatile Cache Command Proposal for ATA8-ACS" which is maintained by the T13 Technical Committee. The ATA8-ACS proposal discusses interfacing with a traditional HDD device having rotating media and also having non-volatile cache memory instead of volatile (e.g., RAM) cache memory as discussed above. The various embodiments of the present disclosure can also utilize the proposed ATA8-ACS protocol. For example, a host 110 may indicate through the use of non-volatile cache commands that data is to be stored in what the host 110 believes to be the non-volatile cache memory according to the ATA8-ACS protocol. A controller 170 according to one or more of the various embodiments interprets the ATA8-ACS command and directs the data to the SLC (e.g., lowest density) memory 132 of the memory device 100. Data that the host 110 directs to be stored on what the host 110 believes to be the rotating magnetic media would instead be directed by the controller 170 to the MLC (e.g., higher density) memory 134 of the memory device 100. In accordance with the ATA8-ACS protocol, the host 110 may pin one or more LBAs to what the host 110 believes to be the non-volatile cache memory portion of the memory device. According to the various embodiments, these LBAs would be pinned to the SLC memory 132, or the lowest density memory of the memory device 100 according to embodiments of the present disclosure.

In other embodiments of the present disclosure, the host 110 may be aware of the true nature (e.g. flash memory) of the memory device 100. In this embodiment the host can maintain the usage table for the memory device and instruct the memory device controller 170 to perform the various operations of various embodiments as discussed previously and as shown in FIG. 2. For example, the host 110 can instruct the memory device 100 to store data in the SLC memory 132 of the memory device based on the nature of the data to be stored. For example, the host 110 may assign 214 the FAT for the memory device 100 to be stored in the SLC memory 132 of the memory device 100 due to the likelihood of frequent updates to the FAT. The host 110 may also direct data 206 to be stored in the MLC memory of the memory device due to the likelihood that the LBA will not be frequently used (e.g. written to). Along with the data to be stored, the host can also send an indicator (e.g. flag) to the controller 170 indicating the intended destination (e.g. SLC or MLC) of the data in memory device 100.

According to various embodiments, the host may assign all LBAs to the SLC memory, assign all LBAs to MLC memory or may dynamically decide based on the nature of the data where a given LBA is to be assigned. For example, the nature of the data may refer to the known or anticipated frequency of usage of the data to be associated with a given LBA. Whether the LBAs are assigned to SLC, MLC or dynamically assigned, the operations illustrated in FIG. 2 may be performed on the LBAs according to various embodiments of the present disclosure. For example, move operations 220 to MLC memory 134 can occur in order to maintain a sufficient amount of spare locations 218 in SLC memory 132. The decision by the host to perform these operations can be made based on usage table data as maintained by the host 110. The host 110 can also inquire as to the amount of SLC and MLC memory contained in the memory device 100. Embodiments of the present disclosure may also utilize memory devices capable of being configured as entirely SLC, entirely MLC or a combination of both SLC and MLC memory. The host may further inquire as to the separation between SLC and MLC designated memory in devices configured as a combination of SLC and MLC memory.

Additional embodiments allow for the memory device controller 170 or a host 110 to maintain a pointer directed towards SLC 132 memory instead of utilizing a usage table 136. Pointers are well known to those skilled in the art. According to these embodiments, a single pointer is used which advances through the SLC 132 memory space. When a new location in SLC memory 132 is needed, the pointer is consulted and the SLC data currently in the location referenced by the pointer is then re-mapped and moved to MLC memory 134. The SLC location referenced by the pointer is then overwritten with the new data to be stored in the SLC memory 132 and the pointer advances to the next SLC memory 132 location. These embodiments may also pin data to SLC (e.g., FAT) that the memory device or host deems appropriate to remain in SLC memory.

Figure 6:
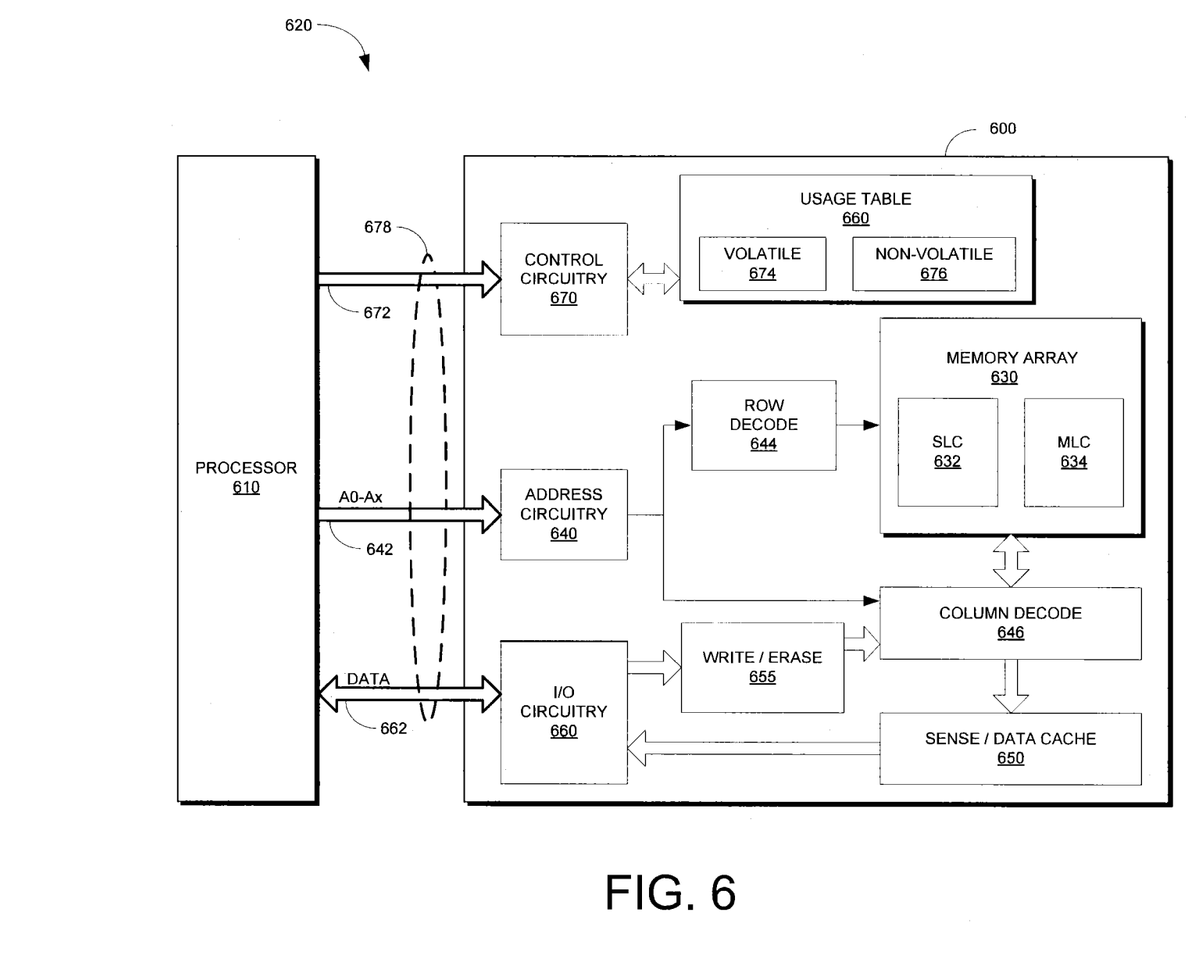
FIG. 6 is a functional block diagram of an electronic system having at least one memory device according to an embodiment of the present disclosure.

FIG. 6 is a functional block diagram of an electronic system having at least one memory device according to an embodiment of the present disclosure. The memory device 600 illustrated in FIG. 6 is coupled to a processor 610. The processor 610 may be a microprocessor or some other type of controlling circuitry. The memory device 600 and the processor 610 form part of an electronic system 620. The memory device 600 has been simplified to focus on features of the memory device that are helpful in understanding the embodiments of the present disclosure.

The memory device 600 includes an array of memory cells 630 that can be arranged in banks of rows and columns. The memory array 630 comprises at least two arrays of memory 632/634 having different densities. Memory array segment 632 may be SLC or MLC (four level) memory and memory array segment 634 may be MLC (eight level) memory, for example. According to one or more embodiments, these memory cells are flash memory cells. Each array 632/634 can consist of multiple banks and blocks of memory cells.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/data cache circuitry 650. The sense/data cache circuitry 650, in one embodiment, is coupled to read and latch a row of data from the memory array 630. Data input and output buffer circuitry 660 is included for bi-directional data communication over a plurality of data connections 662 with the processor 610. Write circuitry 655 is provided to write data to the memory array 630.

The control circuitry 670 is further shown coupled to a usage table block 660. The usage table 660 according to various embodiments of the present disclosure stores the data relating to the usage of LBAs of the memory array 630. The usage table block 660 may be a separate memory device utilizing both volatile 674 and non-volatile 676 memory as shown in FIG. 6. However, various embodiments of the present disclosure are not so limited. Other embodiments may utilize the memory array 630 to store the usage data of the LBAs. The usage data may reside in a dedicated location of the memory array 630 or may be stored in a location corresponding to the LBA in the memory array 630.

Control circuitry 670 is configured in part to implement the features of various embodiments of the present disclosure. In one embodiment, the control circuitry 670 may utilize a state machine. According to one or more embodiments, the control circuitry 670, address circuitry 640, I/O circuitry 660, row decode 644, write/erase 655, column decode 646 and the sense/data cache 650 functional blocks may comprise the controller 170 shown in FIG. 1. Control signals and commands can be sent by the processor 610 to the memory device 600 over the command bus 672. The command bus 672 may be a discrete signal or may be comprised of multiple signals (e.g. command bus). These command signals 672 are used to control the operations on the memory array 630, including data read, data write (program), and erase operations. The command bus 672, address bus 642 and data bus 662 may all be combined or may be combined in part to form a number of standard interfaces 678. For example, the interface 678 between the memory device 600 and the processor 610 may be a Universal Serial Bus (USB) interface. The interface 678 may also be a standard interface used with many hard disk drives (HDD.) For example, the interface may take the form of an SATA or PATA interface. Other HDD interfaces are known to those skilled in the art.

CONCLUSION

Various embodiments of the present disclosure provide methods for managing logical block addresses based on tracked usage of the logical block addresses being stored in hybrid memory devices having both SLC and MLC memory. Also disclosed is an apparatus configured to perform multiple logical block address management operations wherein the operations are performed in response to tracked usage of the logical block addresses stored in a hybrid memory device.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is manifestly intended that this invention be limited only by the claims and the equivalents thereof.

What is claimed is:

1. A method for managing data stored on a memory device having a first array of memory cells each memory cell having a first density and a second array of memory cells each memory cell having a second density, comprising:
   determining a nature of data to be associated with a logical location in memory wherein the nature of the data is at least partially based on if the data is accessed during a boot load operation following power up of the memory device;
   at least partially based on the nature, storing the data in one of the first array of memory cells and the second array of memory cells.

2. The method of claim 1, wherein the nature of the data is a frequency of usage of the data.

3. The method of claim 1, further comprising maintaining at least a particular number of spare locations in the first array of memory cells if locations are available in the second array of memory cells by moving data from the first array of memory cells to the second array of memory cells.

4. The method of claim 1, wherein determining the nature of the data comprises determining an anticipated frequency of usage of the data.

5. The method of claim 1, wherein the first array of memory cells are single level memory cells (SLC) and the second array of memory cells are multi-level memory cells (MLC).

6. The method of claim 1, wherein the first array of memory cells comprises MLC memory cells configured to store a first number of bits per memory cell and the second array of memory cells comprises MLC memory cells configured to store a second number of bits per memory cell, and wherein the second number of bits is greater than the first number of bits.

7. The method of claim 6, further comprising storing data corresponding to file allocation table data in the first array of memory cells.

8. The method of claim 1, further comprising pinning a logical address to one of the first array of memory cells and the second array of memory cells in response to a command provided by the host coupled to the memory device.

9. The method of claim 1, further comprising outputting from the memory device a size of the first array of memory cells and a size of the second array of memory cells in response to a request by the host coupled to the memory device.

10. A method for managing data stored on a memory device having a first array of memory cells each memory cell having a first density and a second array of memory cells each memory cell having a second density, comprising:
    determining a nature of data to be associated with a logical location in memory, wherein determining the nature of the data comprises determining whether the data is accessed during a particular time frame following a power up or reset of the memory device;
    at least partially based on the nature, storing the data in one of the first array of memory cells and the second array of memory cells; and
    maintaining at least a particular number of spare locations in the first array of memory cells if locations are available in the second array of memory cells by moving data from the first array of memory cells to the second array of memory cells.

11. The method of claim 10, wherein storing the data further comprises storing the data in one of the first array of memory cells and the second array of memory cells where the second density is greater than the first density.

12. The method of claim 11, wherein the data is stored in the first array of memory cells if it is determined that the data is accessed during a particular time frame following reset of the memory device.

13. A method for managing data stored on a memory device having a first array of memory cells each memory cell having a first density and a second array of memory cells each memory cell having a second density, comprising:
    determining a nature of data to be associated with a logical location in memory, wherein determining a nature of data at least partially comprises determining an anticipated frequency of updates of data associated with the logical location;
    at least partially based on the nature, storing the data in one of the first array of memory cells and the second array of memory cells; and
    maintaining at least a particular number of spare locations in the first array of memory cells if locations are available in the second array of memory cells by moving data from the first array of memory cells to the second array of memory cells;
    wherein the second density is greater than the first density.

14. The method of claim 13, wherein determining a nature of data further comprises determining the nature of the data responsive to an indicator received by the memory device from a host coupled to the memory device.

15. An electronic system comprising:
- a host having a hard disk drive interface utilizing a hard disk drive protocol for interfacing with a hard disk drive having solid state memory and magnetic media memory;
- a memory device configured to emulate a hard disk drive and coupled to the host at least in part through the hard disk drive interface, the memory device comprising:
- a first array of memory cells wherein each memory cell has a first density;
- a second array of memory cells wherein each memory cell has a second density; and
- control circuitry configured to store data indicated by the host to be stored in the solid state memory of a hard disk drive in the first array of memory cells and store data indicated by the host to be stored in the magnetic media of a hard disk drive in the second array of memory cells;
- wherein the first density is less than the second density.

16. The electronic system of claim 15, wherein the first array of memory cells are single level memory cells (SLC) and the second array of memory cells are multi-level memory cells (MLC).

17. The electronic system of claim 15, wherein the first array of memory cells comprises MLC memory cells configured to store a first number of bits per memory cell and the second array of memory cells comprises MLC memory cells configured to store a second number of bits per memory cell, and wherein the second number of bits is greater than the first number of bits.

18. The electronic system of claim 15, wherein the control circuitry is further configured to pin a logical address to one of the first array of memory cells and the second array of memory cells in response to a command provided by the host.

19. The electronic system of claim 15, wherein the control circuitry is further configured to output a size of the first array of memory cells and a size of the second array of memory cells in response to a request by the host.

20. A method for managing data stored on a memory device having a first array of memory cells each memory cell having a first density and a second array of memory cells each memory cell having a second density, comprising:
- determining a nature of data to be associated with a logical location in memory;
- at least partially based on the nature, storing the data in one of the first array of memory cells and the second array of memory cells; and
- maintaining at least a particular number of spare locations in the first array of memory cells if locations are available in the second array of memory cells by moving data from the first array of memory cells to the second array of memory cells.

21. A method for managing data stored on a memory device having a first array of memory cells each memory cell having a first density and a second array of memory cells each memory cell having a second density, comprising:
- determining a nature of data to be associated with a logical location in memory;
- at least partially based on the nature, storing the data in one of the first array of memory cells and the second array of memory cells; and
- outputting from the memory device a size of the first array of memory cells and a size of the second array of memory cells in response to a request by the host coupled to the memory device.

* * * * *